United States Patent
Lee et al.

(10) Patent No.: US 11,757,058 B2
(45) Date of Patent: Sep. 12, 2023

(54) SOLAR CELL PANEL

(71) Applicant: Shangrao Jinko solar Technology Development Co., LTD, Jiangxi (CN)

(72) Inventors: Jinhyung Lee, Seoul (KR); Sangwook Park, Seoul (KR)

(73) Assignee: SHANGRAO JINKO SOLAR TECHNOLOGY DEVELOPMENT CO LTD, Jiangxi (CN)

( * ) Notice: Subject to any disclaimer, the term of this patent is extended or adjusted under 35 U.S.C. 154(b) by 116 days.

(21) Appl. No.: 15/816,687

(22) Filed: Nov. 17, 2017

(65) Prior Publication Data

US 2018/0138343 A1 May 17, 2018

(30) Foreign Application Priority Data

Nov. 17, 2016 (KR) .................. 10-2016-0153485

(51) Int. Cl.
*H01L 31/05* (2014.01)
*H01L 31/0224* (2006.01)

(52) U.S. Cl.
CPC .. *H01L 31/0508* (2013.01); *H01L 31/022433* (2013.01); *H01L 31/022466* (2013.01); *Y02E 10/50* (2013.01)

(58) Field of Classification Search
CPC ............... H01L 31/0508; H01L 31/022466
(Continued)

(56) References Cited

U.S. PATENT DOCUMENTS

2009/0032081 A1* 2/2009 Saita ............... H01L 31/022425
136/244
2014/0373911 A1* 12/2014 Lee ................. H01L 31/022433
136/256
(Continued)

FOREIGN PATENT DOCUMENTS

CN 103199126 A 7/2013
CN 103730194 A 4/2014
(Continued)

OTHER PUBLICATIONS

Hu et al., "Metal nanogrids, nanowires, and nanofibers for transparent electrodes," Mrs Bulletin, vol. 36, No. 10, Oct. 1, 2011, XP055051169, Total pp. 6.
(Continued)

*Primary Examiner* — Dustin Q Dam
(74) *Attorney, Agent, or Firm* — Tucker Ellis LLP

(57) ABSTRACT

Disclosed is a solar cell panel including a plurality of solar cells including a first solar cell and a second solar cell. Each of the first and second solar cells includes a semiconductor substrate, a first conductive area disposed on a first surface of the semiconductor substrate, a second conductive area disposed on a second surface of the semiconductor substrate which is opposite the first surface of the semiconductor substrate, a first transparent electrode layer disposed on the first conductive area, a second transparent electrode layer disposed on the second conductive area, and a plurality of interconnectors spaced apart from one another at a constant pitch on the first transparent electrode layer so as to extend in a given direction. Each of the first and second solar cells lacks a metal electrode intersecting the plurality of interconnectors on the semiconductor substrate.

20 Claims, 12 Drawing Sheets

(58) Field of Classification Search
USPC .................................................. 136/243–265
See application file for complete search history.

(56) References Cited

U.S. PATENT DOCUMENTS

| | | | |
|---|---|---|---|
| 2015/0020864 A1* | 1/2015 | Dufourcq | H01L 31/03923 |
| | | | 136/244 |
| 2015/0357497 A1* | 12/2015 | Mu | C09J 123/0853 |
| | | | 136/256 |
| 2016/0093752 A1 | 3/2016 | Kim et al. | |
| 2017/0170342 A1* | 6/2017 | Harada | H01L 31/035281 |

FOREIGN PATENT DOCUMENTS

| | | | |
|---|---|---|---|
| CN | 104051549 A | | 9/2014 |
| JP | 2000-261012 | * | 9/2000 |
| JP | 2014-27133 A | | 2/2014 |
| JP | 2016-72637 A | | 5/2016 |
| JP | 2016-186842 A | | 10/2016 |
| KR | 10-2015-0090606 A | | 8/2015 |
| KR | 10-2016-0038694 A | | 4/2016 |
| KR | 10-2017-0017576 A | | 2/2017 |
| KR | 20170055945 A | | 5/2017 |
| KR | 10-2017-0112971 A | | 10/2017 |
| WO | WO 2013/073211 A1 | | 5/2013 |

OTHER PUBLICATIONS

Papet et al., "New cell metallization patterns for heterojunction solar cells interconnected by the Smart Wire Connection Technology," Elsevier, Energy Procedia, vol. 67, Apr. 1, 2015, XP055464479, pp. 203-209.

Yao et al., "Module integration of Solar Cells with Diverse Metallization Schemes Enabled by SmartWire Connection Technology," 2015 IEEE 42nd Photovoltaic Specialist Conference (PVSC), IEEE, Jun. 14, 2015, XP032828929, Total pp. 5.

Thomas et al., "Metal-free crystalline silicon solar cells in module," 2015 IEEE 42nd Photovoltaic Specialist Conference (PVSC), Jun. 15-19, 2015, 4 pages.

Notice of Allowance of corresponding Korean Application No. 10-2018-0033458, dated Jan. 25, 2023, 6 pages.

Office Action of corresponding Korean Application No. 10-2018-0033458, dated Aug. 24, 2022, 22 pages.

* cited by examiner

SOLAR CELL PANEL

CROSS-REFERENCE TO RELATED APPLICATION

This application claims the priority benefit of Korean Patent Application No. 10-2016-0153485, filed on Nov. 17, 2016 in the Korean Intellectual Property Office, the disclosure of which is incorporated herein by reference in its entirety.

BACKGROUND OF THE INVENTION

1. Field of the Invention

Embodiments of the present invention relate to a solar cell panel, and more particularly, to a solar cell panel including a plurality of solar cells electrically connected to one another.

2. Description of the Related Art

Recently, due to depletion of existing energy resources, such as oil and coal, interest in alternative sources of energy to replace the existing energy resources is increasing. Most of all, solar cells are popular next generation cells to convert sunlight into electrical energy.

Solar cells may be manufactured by forming various layers and electrodes based on some design. The efficiency of solar cells may be determined by the design of the various layers and electrodes. In order for solar cells to be commercialized, it is required to maximize the efficiency of solar cells and to minimize manufacturing costs thereof.

SUMMARY OF THE INVENTION

Therefore, the embodiments of the present invention have been made in view of the above problems, and it is an object of the embodiments of the present invention to provide a solar cell panel capable of increasing the output thereof.

According to an aspect of the present invention, the above and other objects can be accomplished by the provision of a solar cell panel including a plurality of solar cells including a first solar cell and a second solar cell, wherein each of the first and second solar cells includes a semiconductor substrate, a first conductive area disposed on a first surface of the semiconductor substrate, a second conductive area disposed on a second surface of the semiconductor substrate which is opposite the first surface of the semiconductor substrate, a first transparent electrode layer disposed on the first conductive area, a second transparent electrode layer disposed on the second conductive area, and a plurality of interconnectors spaced apart from one another at a constant pitch on the first transparent electrode layer so as to extend in a given direction, and each of the first and second solar cells lacks a metal electrode intersecting the plurality of interconnectors on the semiconductor substrate.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE EMBODIMENTS

Figure 1:
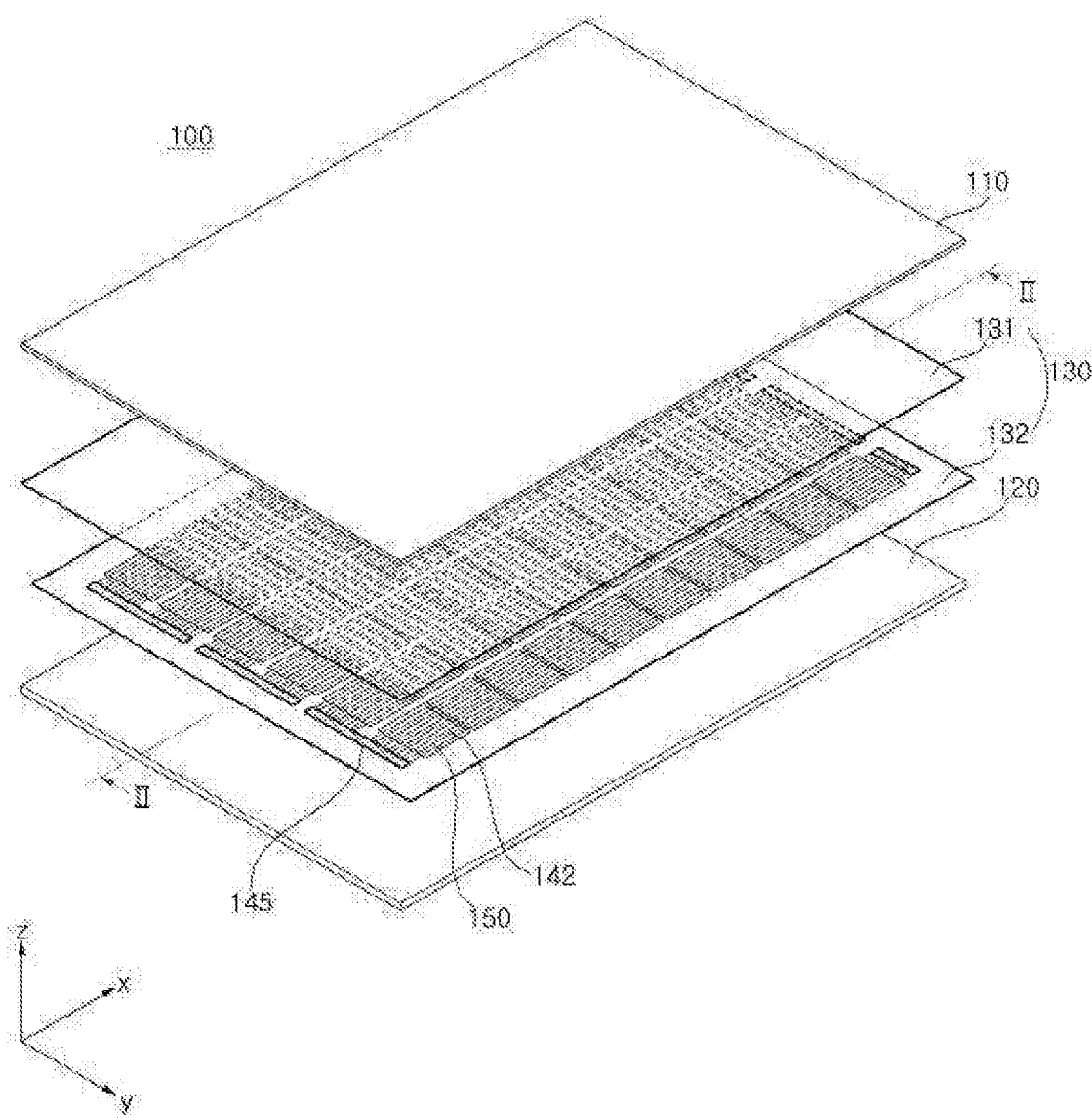
FIG. 1 is a perspective view illustrating a solar cell panel according to an embodiment of the present invention.

Reference will now be made in detail to the embodiments of the present invention, examples of which are illustrated in the accompanying drawings. However, the present invention is not limited to these embodiments, and of course, may be altered in various forms.

In the drawings, to clearly and briefly explain the present invention, illustration of elements having no connection with the description is omitted, and the same or extremely similar elements are designated by the same reference numerals throughout the specification. In addition, in the drawings, for more clear explanation, the thickness, the width, and the like are exaggerated or reduced, and the thickness, width, and the like of the present invention are not limited to the illustration of the drawings.

In addition, in the entire specification, when an element is referred to as "including" another element, the element should not be understood as excluding other elements so long as there is no special conflicting description, and the element may include at least one other element. In addition, it will be understood that, when an element such as a layer, film, region or substrate is referred to as being "on" another element, it can be directly on the other element or intervening elements may also be present. On the other hand, when an element such as a layer, film, region or substrate is referred to as being "directly on" another element, this means that there are no intervening elements therebetween.

Hereinafter, a solar cell panel according to an embodiment of the present invention will be described in detail with reference to the accompanying drawings.

Figure 2:
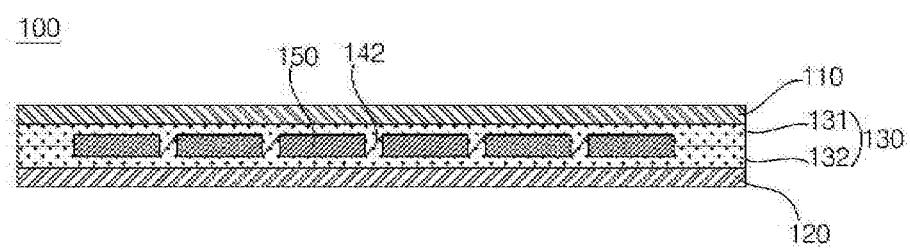
FIG. 2 is a cross-sectional view taken along line II-II of FIG. 1.

FIG. 1 is a perspective view illustrating a solar cell panel according to an embodiment of the present invention, and FIG. 2 is a cross-sectional view taken along line II-II of FIG. 1.

Referring to FIGS. 1 and 2, the solar cell panel according to the present embodiment, designated by reference numeral 100, includes a plurality of solar cells 150 and interconnectors 142 configured to electrically interconnect the solar cells 150. In addition, the solar cell panel 100 includes a sealing member 130 configured to surround and seal the solar cells 150 and the interconnectors 142 for interconnection of the solar cells 150, a front substrate 110 disposed on the front surface of the solar cells 150 above the sealing member 130, and a back substrate 120 disposed on the back surface of the solar cells 150 above the sealing member 130. This will be described below in more detail.

In the present embodiment, the solar cells 150 may be electrically interconnected in series and/or in parallel by the interconnectors 142. The interconnectors 142 and the solar cells 150 will be described later in more detail.

In addition, bus ribbons 145 interconnect alternate ends of the interconnectors 142, which interconnect the solar cells 150 in columns (in other words, solar cell strings). The bus ribbons 145 may be located on the ends of the solar cell strings so as to cross the solar cell strings. The bus ribbons 145 may interconnect the solar cell strings adjacent to each other, or may connect the solar cell string(s) to a junction box (not illustrated), which prevents the backflow of current. The material, shape, connection structure, and the like of the bus ribbons 145 may be altered in various ways, and the present invention is not limited as to them.

The sealing member 130 may include a first sealing member 131 disposed on the front surface of the solar cells 150 interconnected by the interconnectors 142, and a second sealing member 132 disposed on the back surface of the solar cells 150. The first sealing member 131 and the second sealing member 132 prevent the introduction of moisture and oxygen, and realize a chemical bond between respective elements of the solar cell panel 100. The first and second sealing members 131 and 132 may be formed of an insulation material having light-transmissive and adhesive properties. The back substrate 120, the second sealing member 132, the solar cells 150, the first sealing member 131, and the front substrate 110 may be integrated with one another so as to construct the solar cell panel 100 via, for example, a lamination process using the first and second sealing members 131 and 132.

The front substrate 110 is disposed on the first sealing member 131 and configures the front surface of the solar cell panel 100. The back substrate 120 is disposed on the second sealing member 132 and configures the back surface of the solar cell panel 100. Each of the front substrate 110 and the back substrate 120 may be formed of an insulation material capable of protecting the solar cells 150 from external shocks, moisture, ultraviolet light, and the like. In addition, the front substrate 110 may be formed of a light-transmitting material capable of transmitting light, and the back substrate 120 may be configured as a sheet formed of a light-transmitting material, a material that does not transmit light, or a material that reflects light. In one example, the front substrate 110 and the back substrate 120 may have any of various shapes (e.g. a substrate, a film, or a sheet), or may use any of various materials.

The solar cells and the interconnectors, which are included in the solar cell panel according to the embodiment of the present invention will be described below in more detail with reference to FIGS. 3 to 7.

Figure 3:
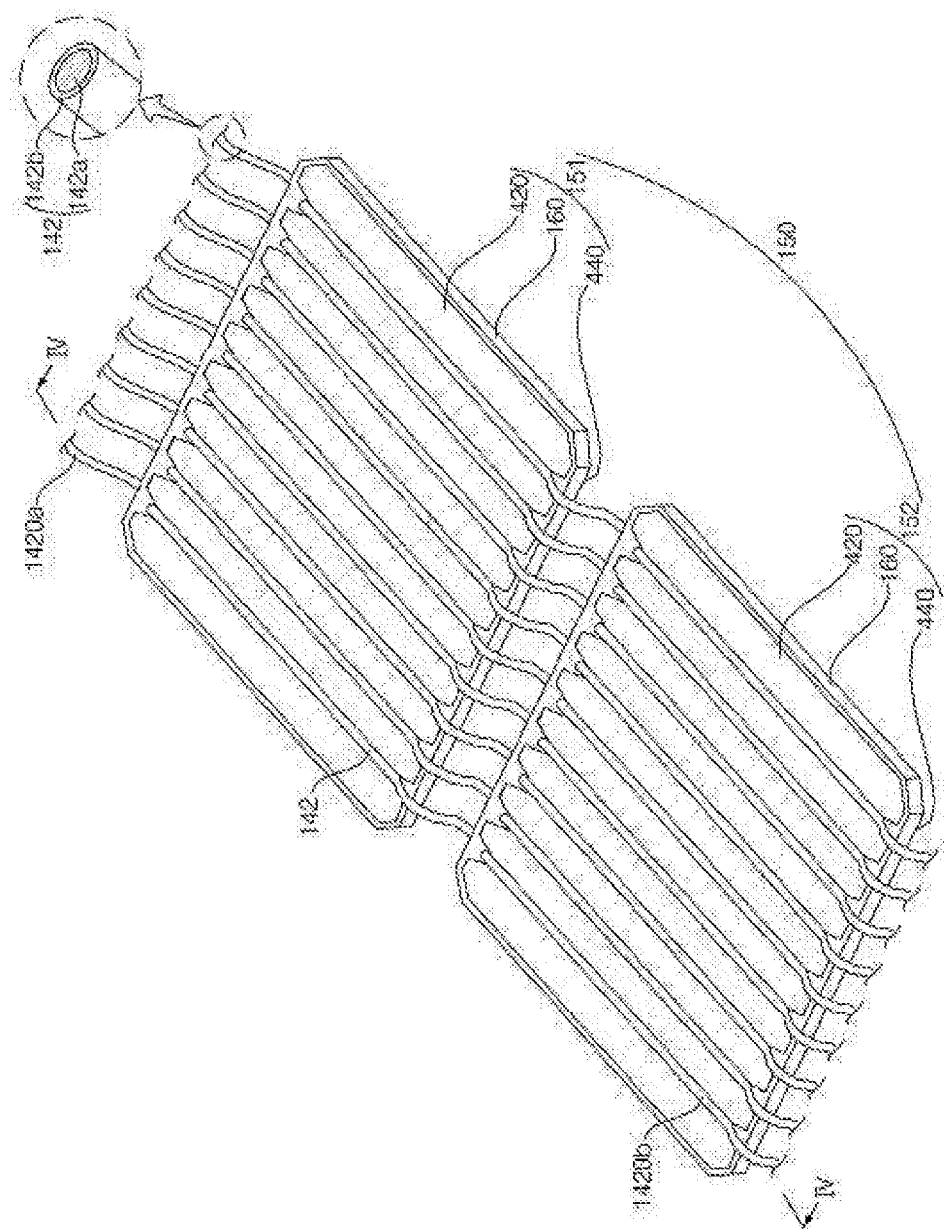
FIG. 3 is a perspective view schematically illustrating a first solar cell and a second solar cell, which are included in the solar cell panel illustrated in FIG. 1 and are interconnected via interconnectors.
Figure 4:
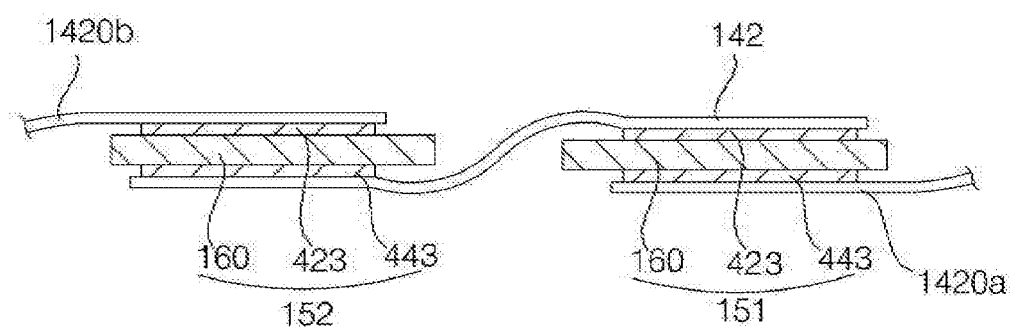
FIG. 4 is a cross-sectional view taken along line IV-IV of FIG. 3.

FIG. 3 is a perspective view schematically illustrating a first solar cell 151 and a second solar cell 152, which are included in the solar cell panel 100 illustrated in FIG. 1 and are interconnected via the interconnectors 142, and FIG. 4 is a cross-sectional view taken along line IV-IV of FIG. 3. FIG. is a partial cross-sectional view illustrating the solar cell 150 and the interconnectors 142 formed thereon, which are included in the solar cell panel 100 illustrated in FIG. 1. For clear and brief illustration, in FIGS. 3 and 4, the first and second solar cells 151 and 152 are merely schematically illustrated based on a semiconductor substrate 160, first and second transparent electrode layers 420 and 440, and first and second electrode lines 423 and 443.

Figure 5:
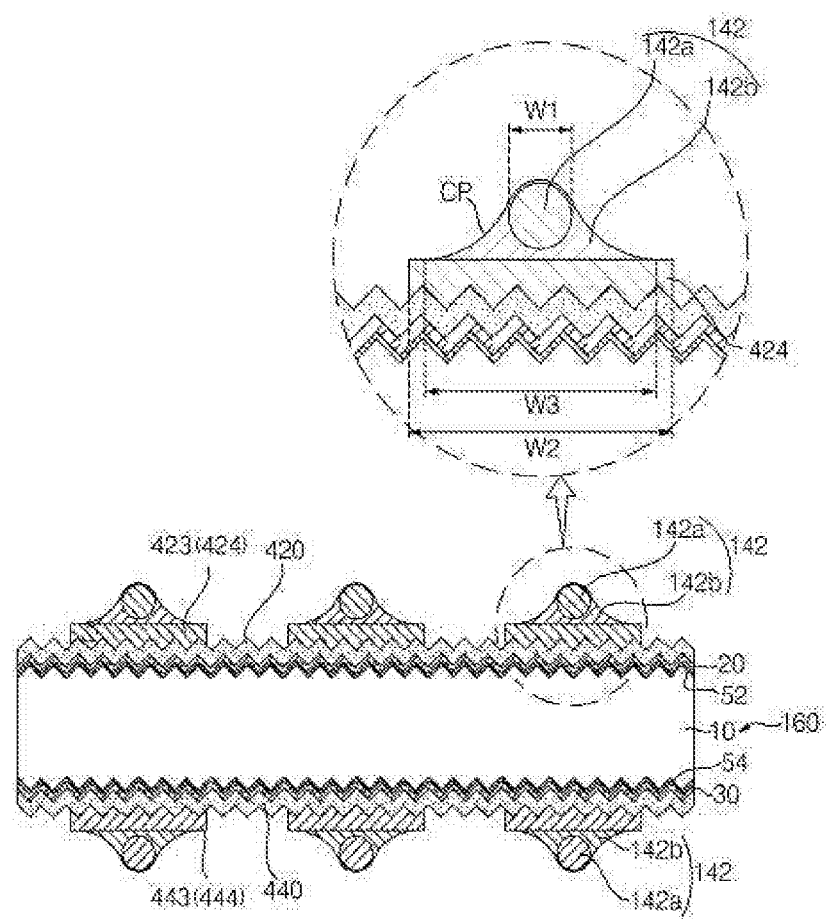
FIG. 5 is a partial cross-sectional view illustrating a solar cell and interconnectors formed thereon, which are included in the solar cell panel illustrated in FIG. 1.

Referring to FIGS. 3 to 5, two neighboring solar cells 150 (e.g. the first solar cell 151 and the second solar cell 152) among the solar cells 150 may be interconnected by the interconnector 142. At this time, the interconnector 142 interconnects a first electrode line 423, which is disposed on the front surface of the first solar cell 151, and a second electrode line 443, which is disposed on the back surface of the second solar cell 152, which is located on one side (the left lower side in FIG. 4) of the first solar cell 151. In addition, another interconnector 1420a interconnects the second electrode line 443, which is disposed on the back surface of the first solar cell 151, and the first electrode line 423, which is disposed on the front surface of another solar cell, which may be located on the other side (the right side in FIG. 4) of the first solar cell 151. In addition, another interconnector 1420b interconnects the first electrode line 423, which is disposed on the front surface of the second solar cell 152, and the second electrode line 443, which is disposed on the back surface of another solar cell, which may be located on one side (the left side in FIG. 4) of the second solar cell 152. In this way, the multiple solar cells 150 may be interconnected to form a single column by the interconnectors 142, 1420a and 1420b. A following description related to the interconnector 142 may be applied to all of the interconnectors 142, 1420a and 1420b, each of which interconnects two neighboring solar cells 150.

The interconnector 142 may cross the first solar cell 151 in the region in which the first electrode line 423 of the first solar cell 151 is located, and then may cross the second solar cell 152 in the region in which the second electrode line 443 of the second solar cell 152 is located. The interconnector 142 may effectively interconnect the first and second solar cells 151 and 152 with a width W1 thereof that is smaller than the first and second solar cells 151 and 152 (for example, a small area to correspond to the electrode line (see reference numeral 423 in FIG. 6).

When viewing one surface of each solar cell 150, the multiple interconnectors 142 may be provided to improve the electrical connection between neighboring solar cells 150. In particular, in the present embodiment, the interconnector 142 is configured as a wire, which has the width W1 that is smaller than a relatively large width of a conventional ribbon (e.g. within a range from 1 mm to 2 mm) and extends a long length. As such, a greater number of interconnectors 142 than the number of conventional ribbons (e.g. two to five ribbons) are used on one surface of each solar cell 150.

In one example, each interconnector 142 may include a core layer 142a, which is formed of a metal, and a solder layer 142b, which is coated over the surface of the core layer 142a at a small thickness and includes a solder material so as to enable soldering with the electrode lines 423 and 443. In one example, the core layer 142a may include Ni, Cu, Ag, or Al as a main material (i.e. a material included in an amount of 50 wt % or more, more specifically, 90 wt % or more). The solder layer 142b may be formed of an alloy including at least one of tin (Sn), lead (Pb), silver (Ag), bismuth (Bi), and indium (In). In one example, the solder layer 142b may be formed of, for example, Pb, Sn, SnIn, SnBi, SnBiPb, SnPb, SnPbAg, SnCuAg, or SnCu. However, the present invention is not limited thereto, and the core layer 142a and the solder layer 142b may include various other materials. In addition, the interconnector 142 may include only the core layer 142a formed of a metal, without including the solder layer 142b.

Meanwhile, when the interconnector 142 includes the solder layer 142b formed of a tin compound including indium, the interconnector 142 may be directly formed on a first transparent electrode layer 420 without the first electrode line 423. A detailed description will be provided later.

When the wire, which has a width smaller than a conventional ribbon, is used as the interconnector 142, material costs may be considerably reduced. In addition, because the interconnector 142 has a width smaller than the ribbon, a sufficient number of interconnector 142 may be provided to minimize the movement distance of carriers, which may enhance the output of the solar cell panel 100. In addition, the wire, which configures the interconnector 142 according to the present embodiment, may include a rounded portion. That is, the wire, which configures the interconnector 142, may have a circular, oval, or curvilinear cross section, or a rounded cross section. Thereby, the interconnector 142 may cause reflection or diffused reflection. In this way, light reflected from the rounded surface of the wire, which configures the interconnector 142, may be reflected or totally reflected by the front substrate 110 or the back substrate 120, which is disposed on the front surface or the back surface of the solar cell 150, to thereby be reintroduced into the solar cell 150. Thereby, the output of the solar cell panel 100 may be effectively enhanced. In addition, the interconnector 142 having this shape may be easily manufactured. However, the present invention is not limited thereto. Accordingly, the wire, which configures the interconnector 142, may have a polygonal shape, such as a rectangular shape, or may have any of various other shapes.

Meanwhile, in the present embodiment, the width (or the diameter) of the interconnector 142 may range from 100 um to 300 um, and, for example, may range from 150 um to 200 um.

In this specification, the width W1 of the interconnector 142 may mean the width or diameter of the interconnector 142 or the core layer 142a measured in the plane, which passes through the center of the interconnector 142 and is perpendicular to the thickness direction of the solar cell 150. For reference, after the interconnector 142 is attached to the electrode lines 423 and 433, since a portion of the solar layer 142a that is located at the center of the core layer 142a is very thin, the solder layer 142b has no great effect on the width W1 of the interconnector 142.

By the interconnector 142 that has the above-described width W1 and takes the form of a wire, current generated in the solar cell 150 may be efficiently transferred to an external circuit (e.g. a bus ribbon or a bypass diode of a junction box) or another solar cell 150. When the width W1 of the interconnector 142 is below 100 um, the strength of the interconnector 142 may be insufficient and the connection area between the interconnector 142 and the electrode lines 423 and 443 may be very small, which may result in poor electrical connection and low attachment force. When the width W1 of the interconnector 142 exceeds 300 um, the cost of the interconnector 142 may increase, and the interconnector 142 may prevent light from being introduced into the front surface of the solar cell 150, thereby increasing shading loss.

In addition, the interconnector 142 may receive force so as to be spaced apart from the electrode lines 423 and 443, which may cause low attachment force between the interconnector 142 and the electrode lines 423 and 443 and may generate, for example, cracks in the electrode lines 423 and 443 or the semiconductor substrate 160. In consideration of this attachment force and the like, the width W1 of the interconnector 142 may range from 150 um to 200 um. With this range, the interconnector 142 may achieve increased attachment force for the electrode lines 423 and 443, and may enhance the output of the solar cell 150.

In the present embodiment, the interconnector 142 may be individually attached to and fixed on the electrode lines 423 and 443 of the solar cell 150 by the solder layer 142b, rather than being inserted into, for example, a separate layer or film, or being covered therewith. Thereby, after the interconnector 142 is attached to the electrode lines 423 and 443, the solder layer 142b disposed on the electrode lines 423 and 443 have a specific shape. This will be described later in detail.

In the present embodiment, the multiple interconnectors 142, which extend in a given direction, may be arranged at a constant interval, and the number of interconnectors 142 may range from 12 to 30 (e.g. 25 to 30) on the basis of one surface of the solar cell 150. When the number of interconnectors 142 is below 12, it may be difficult to expect a great deal of enhanced output. In addition, the output of the solar cell panel 100 may be no longer increased even if the number of interconnectors 142 exceeds a given number, and an increase in the number of interconnectors 142 may increase burden on the solar cell 150. In consideration of this, the number of interconnectors 142 may be 30 or less. At this time, the number of interconnectors 142 may be 25 or more in order to further enhance the output of the solar cell panel 100, and the number of interconnectors 142 may be 30 or less in order to reduce burden by the interconnectors 142.

In the present embodiment, since the first layer 420 may include only the first electrode line 423 and may not additionally include a finger line that intersects the first electrode line 423, the number of interconnectors 142 may be increased compared to the related art. A more detailed description will be provided later.

Referring to FIG. 5, the solar cell 150 according to the present embodiment may include the semiconductor substrate 160 including a base area 10, a first passivation layer 52 formed on the front surface of the semiconductor substrate 160, a second passivation layer 54 formed on the back surface of the semiconductor substrate 160, a first conductive area 20 formed on the first passivation layer 52 at the front surface side of the semiconductor substrate 160, a second conductive area 30 formed on the second passivation layer 54 at the back surface side of the semiconductor substrate 160, the first transparent electrode layer 420 and the first electrode line 423, which are electrically connected to the first conductive area 20, and the second transparent electrode layer 440 and the second electrode line 443, which are electrically connected to the second conductive area 30. This will be described below in more detail.

The semiconductor substrate 160 may be formed of crystalline semiconductors of a first or second conductive type by being doped with a first or second conductive dopant, which is a base dopant, at a low doping concentration. In one example, the semiconductor substrate 160 may be formed of monocrystalline or polycrystalline semiconductors (e.g. monocrystalline or polycrystalline silicon). In particular, the semiconductor substrate 160 may be formed of monocrystalline semiconductors (e.g. a monocrystalline semiconductor wafer, and more specifically, a monocrystalline silicon wafer). Such a solar cell 150 may have excellent electrical properties because it is based on the semiconductor substrate 160 having high crystallinity and thus low defects. At this time, in the present embodiment, the semiconductor substrate 160 may include only the base area 10 without including a doped area that is formed by, for example, additional doping. Thereby, deterioration in the passivation property of the semiconductor substrate 160 due to the doped area may be prevented.

The front surface and/or the back surface of the semiconductor substrate 160 may be subjected to texturing so as to have protrusions. In one example, the protrusions may be configured by particular crystalline faces. For example, each protrusion may have a substantially pyramidal shape, which is defined by four outer (111) faces. When the protrusions are formed on the surface of the semiconductor substrate 160 via texturing, the reflectance of light introduced into the semiconductor substrate 160 may be prevented, which may effectively reduce shading loss. However, the present invention is not limited thereto, and no protrusions may be formed on the surface of the semiconductor substrate 160.

The first passivation layer 52 is formed on (e.g. in contact with) the front surface of the semiconductor substrate 160, and the second passivation layer 54 is formed on (e.g. in contact with) the back surface of the semiconductor substrate 160. Thereby, the passivation property may be improved. At this time, the first and second passivation layers 52 and 54 may be formed respectively throughout the front surface and the back surface of the semiconductor substrate 160. Thereby, the first and second passivation layers 52 and 54 may be easily formed to attain an excellent passivation property without separate patterning. Since carriers are transferred to the first or second conductive area 20 or 30 by passing through the first or second passivation layer 52 or 54, the thickness of each of the first and second passivation layers 52 and 54 may be smaller than the thickness of each of the first conductive area 20 and the second conductive area 30.

In one example, each of the first and second passivation layers 52 and 54 may be formed as an intrinsic amorphous semiconductor (e.g. intrinsic amorphous silicon (i-a-si) layer. As such, since the first and second passivation layers 52 and 54 include the same semiconductor material as the semiconductor substrate 160 and have properties similar to those of the semiconductor substrate 160, the passivation property may be more effectively improved. Thereby, the surface properties of the semiconductor substrate 160 may be greatly improved. However, the present invention is not limited thereto. Thus, the first and/or second passivation layers 52 and 54 may include an intrinsic amorphous silicon carbide (i-a-SiCx) layer or an intrinsic amorphous silicon oxide (i-a-SiOx) layer. Thereby, although the effect by a wide energy band gap may be improved, the passivation property may be slightly reduced compared to the case where the passivation layer includes an intrinsic amorphous silicon (i-a-Si) layer.

The first conductive area 20 may be disposed on (e.g. in contact with) the first passivation layer 52. The first conductive area 20 may include a first conductive dopant, or may be of a first conductive type, and may have a higher doping concentration than the semiconductor substrate 160. In addition, the second conductive area 30 may be disposed on (e.g. in contact with) the second passivation layer 54. The second conductive area 30 may include a second conductive dopant of a second conductive type, which is the opposite of the first conductive type, or may be of a second conductive type. When the first and second passivation layers 52 and 54 respectively come into contact with the first and second conductive areas 20 and 30, the carrier transfer path may be reduced, and the resulting structure may be simplified.

Since the first conductive area 20 and the second conductive area 30 are formed on the semiconductor substrate 160 separately from the semiconductor substrate 160, the first conductive area 20 and the second conductive area 30 may have a different material and/or crystalline structure from that of the semiconductor substrate 160 in order to be easily formed on the semiconductor substrate 160.

For example, each of the first conductive area 20 and the second conductive area 30 may be formed by doping, for example, an amorphous semiconductor layer, which may be easily manufactured via any of various methods, such as, for example, deposition, with a first or second conductive dopant. As such, the first conductive area 20 and the second conductive area 30 may be easily formed via a simplified process.

At this time, the semiconductor substrate 160 may be of a first conductive type. As such, the first conductive area 20 may configure a front-surface field area, which is of the same conductive type as the semiconductor substrate 160 and has a high doping concentration, and the second conductive area 30 may configure an emitter area, which is of a conductive type opposite that of the semiconductor substrate 160. A p-type dopant, used as the first or second conductive dopant, may be a group-III element, such as boron (B), aluminum (Al), gallium (ga), or indium (In), and an n-type dopant may be a group-V element, such as phosphorus (P), arsenic (As), bismuth (Bi), or antimony (Sb). In addition, any of various other dopants may be used as the first or second conductive dopant.

In one example, the semiconductor substrate 160 and the first conductive area 20 may be of an n-type, and the second conductive area 30 may be of a p-type. Thereby, the n-type semiconductor substrate 160 may provide an excellent carrier lifetime. In one example, the semiconductor substrate 160 and the first conductive area 20 may include phosphorus (P) as the n-type dopant, and the second conductive area 30 may include boron (B) as the p-type dopant. However, the present invention is not limited thereto, and the first conductive type may be a p-type and the second conductive type may be an n-type.

In the present embodiment, each of the first conductive area 20 and the second conductive area 30 may include at least one of an amorphous silicon (a-Si) layer, an amorphous silicon oxide (a-SiOx) layer, an amorphous silicon carbide (a-SiCx) layer, an indium-gallium-zinc oxide (IGZO) layer, a titanium oxide (TiOx) layer, and a molybdenum oxide (MoOx) layer. At this time, the amorphous silicon (a-Si) layer, the amorphous silicon oxide (a-SiOx) layer, and the amorphous silicon carbide (a-SiCx) layer may be doped with the first or second conductive dopant.

The indium-gallium-zinc oxide (IGZO) layer, the titanium oxide (TiOx) layer, and the molybdenum oxide (MoOx) layer may perform the same role as an n-type or p-type conductive area by selectively collecting electrons or holes without a dopant. In one example, the first and second conductive areas 20 and 30 may include an amorphous silicon layer. Thereby, the first and second conductive areas 20 and 30 may include the same semiconductor layer (i.e. silicon) as the semiconductor substrate 160, and thus may have properties similar to those of the semiconductor substrate 160. Thereby, the movement of carriers may be more effectively realized, and a stabilized structure may be realized.

The first transparent electrode layer 420 and the first electrode line 423 are disposed on (e.g. in contact with) the first conductive area 20, and the second transparent electrode layer 440 and the first electrode line 443 are disposed on (e.g. in contact with) the second conductive area 30.

The first electrode line 423 may be bonded to the interconnector 142 or the solder layer 142b.

Here, the first transparent electrode layer 420 may be formed over (e.g. in contact with) the entire first conductive area 20. The term "entire" includes not only the case where the entire first conductive area 20 is covered without leaving an empty space or an empty area, but also the case where a portion of the first conductive area 20 is inevitably excluded. When the first transparent electrode layer 420 is formed over the entire first conductive area 20, carriers may easily reach the first electrode line 423 by passing through the first transparent electrode layer 420, which may result in reduced resistance in the horizontal direction. Because the first conductive area 20, which is configured as an amorphous semiconductor layer, may have relatively low crystallinity, and thus may reduce the mobility of carriers, the provision of the first transparent electrode layer 420 may reduce resistance when carriers move in the horizontal direction.

Because the first transparent electrode layer 420 is formed over the entire first conductive area 20, the first transparent electrode layer 420 may be formed of a material capable of transmitting light (i.e. a light-transmitting material). In one example, the first transparent electrode layer 420 may include at least one of indium tin oxide (ITO), boron zinc oxide (BZO), indium tungsten oxide (IWO), and indium cesium oxide (ICO). However, the present invention is not limited thereto, and the first transparent electrode layer 420 may include any of various other materials.

At this time, the first transparent electrode layer 420 of the present embodiment may include hydrogen, in addition to the above-described material as a main material. When the first transparent electrode layer 420 includes hydrogen, the mobility of electrons or holes may be improved, and transmittance may be improved.

Meanwhile, conductive nano materials including conductive nanowires (e.g. silver nanowires), conductive nano particles, or carbon nanotubes may be dispersed on the first and second transparent electrode layers 420 and 440. The conductive nano materials may be uniformly dispersed on the front surface of each of the first and second transparent electrode layers 420 and 440. Thereby, the conductivity of the first and second transparent electrode layers 420 and 440 may be improved.

In the present embodiment, the first electrode line 423 may be formed on the first transparent electrode layer 420 so as to extend in a given direction. However, the present invention is not limited thereto.

The first electrode line 423, which is disposed on the first transparent electrode layer 420 and is connected to the interconnector 142, may include a metal and a cross-linked resin. When the first electrode line 423 includes a metal, for example, the efficiency of collection of carries and the reduction in resistance may be improved.

Since the first electrode line 423 may prevent the introduction of light because of a metal included therein, the first electrode line 423 may be configured to extend in a given direction so as to minimize shading loss. Thereby, light may be introduced into the region in which no first electrode line 423 is formed. The plan shape of the first electrode line 423 will be described later in more detail with reference to FIG. 6.

For example, the role, material, and shape of the second transparent electrode layers 440 and the second electrode line 443 may be the same as the role, material, and shape of the first transparent electrode layer 420 and the first electrode line 423, except for the fact that the second transparent electrode layer 440 and the second electrode line 443 are disposed on the second conductive area 34, and therefore the description related to the first transparent electrode layer 420 and the first electrode line 423 may be equally applied to the second transparent electrode layer 440 and the second electrode line 443.

At this time, in the present embodiment, the electrode lines 423 and 443, bonded to the interconnector 142 or the solder layer 142b, may be formed of a material that may prevent any material from permeating the solder layer 142b and may be fired by low-temperature firing (e.g. firing at a processing temperature of 300° C. or less). In one example, the electrode lines 423 and 443 may not include glass frit, which includes a given metal compound (e.g. an oxide including oxygen, a carbide including carbon, and a sulfide including sulfur), but may include only conductive metal particles, a cross-linked resin, and any of various other resins (e.g. a curing agent or an additive).

In the present embodiment, since the electrode lines 423 and 443 need to be formed in contact with the first and second transparent electrode layers 420 and 440, a firethrough that penetrates, for example, an insulation film is not required. Accordingly, the electrode lines 423 and 443 may be formed by applying (e.g. printing) low-temperature firing paste, from which glass frit has been removed, and thereafter, performing thermal treatment on the paste. When the low-temperature firing paste or the electrode lines 423 and 443 include no glass frit, the metal in the electrode lines 423 and 443 may be simply cured via aggregation, rather than being sintered, thereby attaining conductivity.

The shape of the electrode lines 423 and 443 and the shape of the interconnector 142 and/or the solder layer 142b bonded to the electrode lines will be described below in more detail with reference to FIG. 5 and FIGS. 6 and 7.

Figure 6:
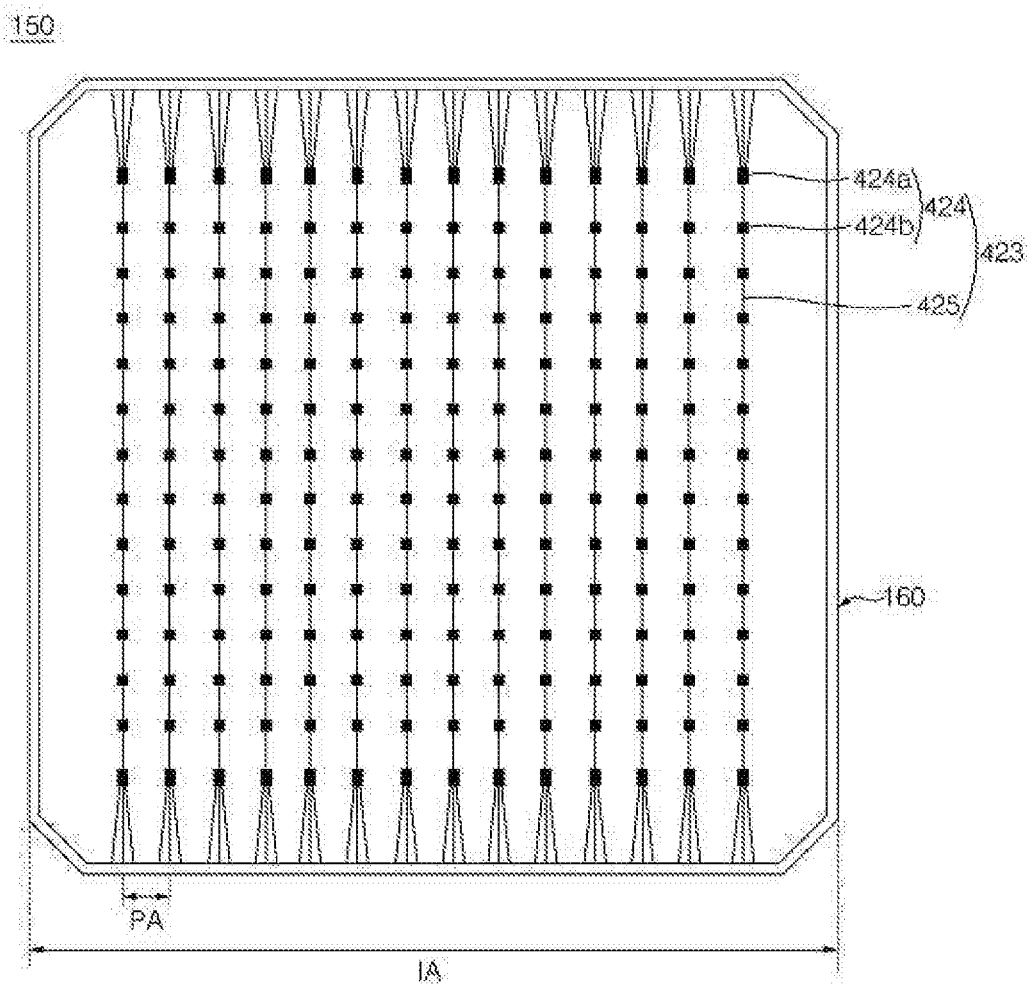
FIG. 6 is a plan view illustrating the solar cell included in the solar cell panel of FIG. 1.

FIG. 6 is a plan view illustrating the solar cell 150 included in the solar cell panel 100 of FIG. 1. FIG. 7 is a plan view illustrating the solar cell 150 and the interconnectors 142 connected thereto, which are included in the solar cell panel 100 of FIG. 1. In FIGS. 6 and 7, the illustration is focused on the semiconductor substrate 160 and the electrode lines 423 and 443. Although the following description will be focused on the first electrode lines 423, it may be directly applied to the second electrode lines 443.

Figure 7:
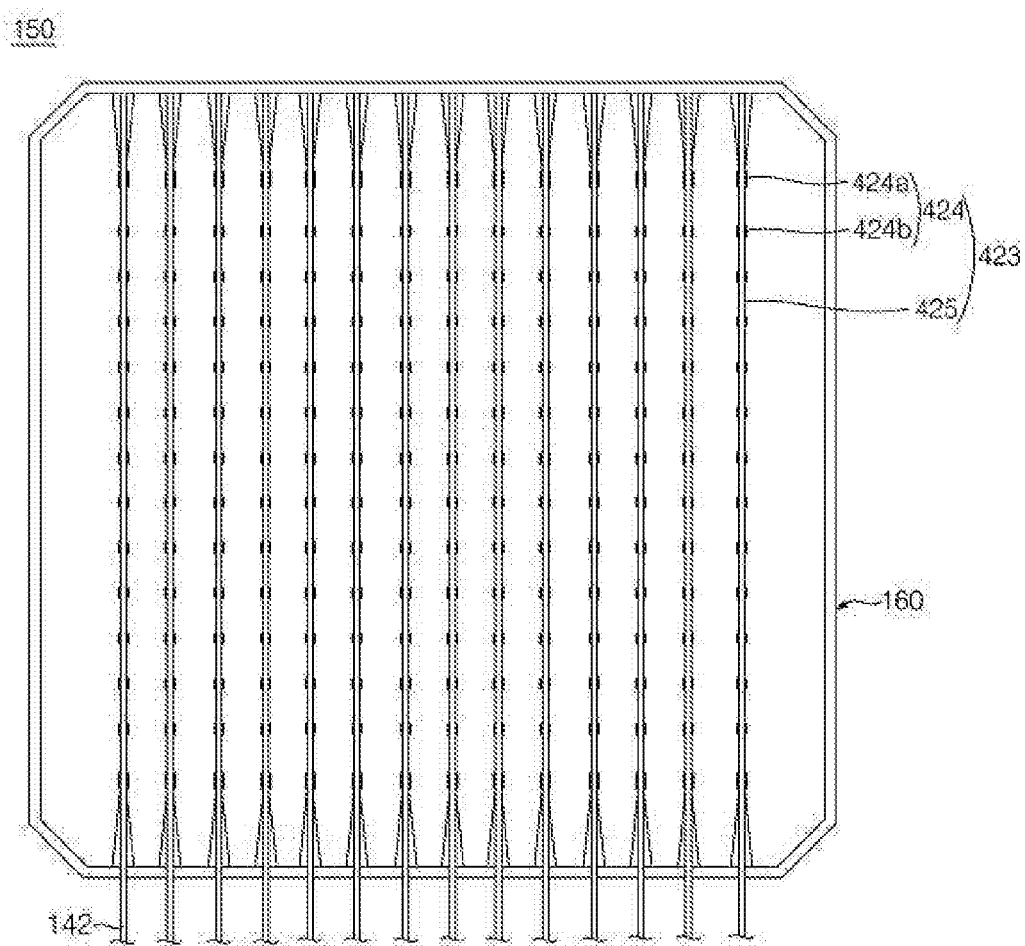
FIG. 7 is a plan view illustrating the solar cell and interconnectors connected thereto, which are included in the solar cell panel of FIG. 1.

Referring to FIGS. 6 and 7, in the present embodiment, the first electrode lines 423 may vertically extend and may be connected to or attached to the interconnectors 142. Since the first electrode lines 423 may be disposed to correspond to the interconnectors 142 in a one-to-one ratio, the description related to, for example, the number and pitch of interconnectors 142 may be directly applied to the number and pitch of first electrode lines 423. In the present embodiment, since the interconnectors 142 are provided in a plural number (e.g. 20 or more) on the basis of one surface of the solar cell 150, the first electrode lines 423 may be provided in a plural number (e.g. 20 or more) so as to correspond to the interconnectors 142.

Specifically, the number of first electrode lines 423 may range from 12 to 30 (e.g. 25 to 30) on the basis of one surface of the solar cell 150. When the number of first electrode lines 423 is below 12, it may be difficult to expect a great deal of enhanced output. In addition, the output of the solar cell panel 100 may be no longer increased even if the number of first electrode lines 423 exceeds a given number, and an increase in the number of first electrode lines 423 may increase burden on the solar cell 150. In consideration of this, the number of first electrode lines 423 may be 30 or less. At this time, the number of first electrode lines 423 may be 25 or more in order to further enhance the output of the solar cell panel 100, and the number of first electrode lines 423 may be 30 or less in order to reduce burden by the first electrode lines 423.

In the present embodiment, since the first electrode line 423 may not include an additional electrode that intersects the first electrode line 423, for example, a finger electrode. That is, the solar cell according to the present embodiment may be electrically connected to the semiconductor substrate 160 using only the first electrode lines 423 that extend in a given direction. That is, in the solar cell according to the present embodiment, the respective first electrode lines 423 may be electrically connected to the neighboring first electrode lines 423 via only the first transparent electrode layer 420 on the semiconductor substrate 160.

Accordingly, the pitch PA of the first electrode lines 423 may be smaller than that in a conventional solar cell. The pitch PA of the first electrode lines 423 may range from 3 mm to 11 mm. When the pitch PA of the first electrode lines 423 is below 3 mm, this may increase burden on the solar cell 150. When the pitch PA of the first electrode lines 423 exceeds 11 mm, it may be difficult to expect a further increase in the output of the solar cell panel 100. However, the pitch PA of the first electrode lines 423 is not limited thereto, and may be changed in various ways according to the design of the solar cell 150.

In addition, in the present embodiment, the pitch PA of the first electrode lines 423 may range from 2% to 7% of the diameter IA of the solar cell 150. Here, the diameter IA of the solar cell 150 is the length of the solar cell 150 measured in the direction that is perpendicular to the direction in which the first electrode line 423 extends.

When the pitch PA of the first electrode lines 423 is below 2% of the diameter IA of the solar cell 150, the area in which shading loss occurs may be increased due to the first electrode lines 423, which may reduce the efficiency of the solar cell 150. When the pitch PA of the first electrode lines 423 exceeds 7% of the diameter IA of the solar cell 150, it may be difficult to expect a further increase in the output of the solar cell panel 100.

In the present embodiment, the first electrode line 423 does not include an additional electrode that intersects the first electrode line 423, for example, a finger electrode. Thus, the cost of the first electrode line 423 may be reduced because it does not require an additional process and material to form the finger electrode. In addition, the output of the solar cell 150 may be enhanced by about 4% to 6% via the appropriate arrangement of the first electrode lines 423.

Meanwhile, in the portions in which the first electrode line 423 and the interconnector 142 are connected to or attached to each other, the first electrode line 423 may include a plurality of pad portions 424 each having a larger width W2 than the solder layer 142b. The pad portions 424 may have the relatively large width W2 to ensure stabilized attachment of the interconnector 142 and to reduce contact resistance. The pad portions 424 may include a plurality of pad portions 424a and 424b, which are spaced apart from each other by a given distance so as to correspond to the respective interconnectors 142. In one example, the pad portions 424a and 424b may include first pads 424a, which are located adjacent to opposite ends of the first electrode lines 423, and second pads 424b excluding the first pads 424a. Since the first pads 424a are located in the portions to which a lot of force may be applied to separate the interconnectors 142 from the solar cell 150, the first pads 424a may have a larger length and/or larger width than the second pads 424b.

Here, the solder layer 142b may have a small thickness that is 20% or less of the width of the core layer 142b. At this time, when the thickness of the solder layer 142b is below 2 um, a tabbing process may not be efficiently performed. In addition, when the thickness of the solder layer 142b exceeds 20 um, the material costs may be increased, and the width of the core layer 142a may be reduced, thus causing deterioration in the strength of the interconnector 142. For reference, a thickness of first and second metal electrode layers may be greater than the thickness of the solder layer 142b. In one example, the thickness of the first and second metal electrode layers may range from 20 um to 40 um. Thereby, the resistance of the first and second metal electrode layers may be reduced, and the interconnector 142 may be stably attached to the first and second metal electrode layers.

The solder layer 142b of each interconnector 142 is located separately from another interconnector 142 or another solder layer 142b. When the interconnector 142 is attached to the solar cell 150 by a tabbing process, each solder layer 142b may wholly flow toward the electrode lines 423 and 443 (more specifically, the pad portions 424) so that the width of the solder layer 142b may gradually increase with decreasing distance to the pad portions 424 in the portion adjacent to each pad portion 424 or the portion located between each pad portion 424 and the core layer 142a. In one example, the portion of the solder layer 142b that is adjacent to each pad portion 424 may have a width W3 that is equal to or greater than the diameter W1 of the core layer 142a. More specifically, the solder layer 142b is configured to protrude outward from the solar cell 150 on the core layer 142a in conformance with the shape of the core layer 142a, whereas the portion of the solder layer 142b that is under the core layer 142b or is adjacent to the pad portion 424 is concavely formed with respect to the outside of the solar cell 150. Thereby, an inflection point CP, the curvature of which varies, is located on the side surface of the solder layer 142b. It can be seen from this shape of the solder layer 142b that the interconnector 142 is individually attached and fixed by the solder layer 142b, without being inserted into or covered with, for example, a separate layer or film. With this simplified structure and process of fixing the interconnector 142 by the solder layer 142b without using a separate layer or film, the solar cell 150 and the interconnector 142 may be connected to each other.

Meanwhile, after the tabbing process, the portion of the interconnector 142 that is located between two solar cells 150 may continuously maintain the same shape as or a similar shape to that before the tabbing process.

Since the width W3 of the solder layer 142b is equal to or less than the width W2 of the pad portion 424, the solder layer 142b is formed only on the surface of the pad portion 424 that is opposite the semiconductor substrate 160 (the upper surface in the enlarged circle of FIG. 5), and is not formed on the side surface of the pad portion 424. Unlike this, when the solder layer 142b is also located on the side surface of the pad portion 424, the solder layer 142b may cause damage to the transparent electrode layers 420 and 440, or may permeate into the first and second transparent electrode layers 420 and 440 and the electrode lines 423 and 423, thus deteriorating the strength of the bond between the first and second transparent electrode layers 420 and 440 and the electrode lines 423 and 423.

In one example, the ratio of the width W1 of the interconnector 142 to the width W3 of the solder layer 142*b* in the portion thereof adjacent to the pad portion 424 may range from 1:1 to 1:3.33. In addition, the ratio of the width W3 of the solder layer 142*b* in the portion thereof adjacent to the pad portion 424 to the width W2 of the pad portion 424 may range from 1:1 to 1:4.5 (e.g. from 1:1 to 1:4.5). When the ratio W3:W2 is below 1:1, the strength of the bond between the interconnector 142 and the pad portion 424 may not be good. When the ratio W3:W2 exceeds 1:4.5, the area of the pad portion 424 is excessively large, thus increasing shading loss and manufacturing costs. When the ratio W3:W2 is 1:1.1 or more, the width W3 of the solder layer 142*b* adjacent to the pad portion 424 may be less than the width W2 of the pad portion 424, which may prevent the solder layer 142*b* from flowing down on the side surface of the pad portion 424, thereby allowing the solder layer 142*b* to be stably disposed on the pad portion 424.

However, the present invention is not limited thereto. The width W1 of the interconnector 142, the width W2 of the pad portion 424, and the width W3 of the solder layer 142*b* may have various values. In addition, instead of forming a line portion 425 separately from the pad portion 424, only one selected from among the pad portion 424 and the line portion 425 may be formed.

In addition, the first electrode line 423 may include the line portion 425, which interconnects the neighboring pad portions 424 and has a smaller width than the pad portion 424. Through provision of the line portion 425, the first electrode line 423 may be continuously formed. The line portion 425 having a small width may minimize the area by which light is blocked so as not to be introduced into the solar cell 150.

The present embodiment illustrates the first electrode line 423 as including the line portion 425 so as to correspond to the interconnector 142.

Alternatively, the width of the line portion 425 may be equal to or less than the width W1 of the interconnector 142. When the interconnector 142 has a circular, oval, or rounded shape, since the width or area by which the lower surface of the interconnector 142 comes into contact with the line portion 425 is not large, the width of the line portion 425 may be equal to or less than the width W1 of the interconnector 142. When the line portion 425 has a relatively small width, the area of the first electrode line 423 may be reduced, which may reduce material costs of the first electrode line 423.

Alternatively, the width of the line portion 425 may range from 30 um to 300 um. When the width of the line portion 425 is below 30 um, the width of the line portion 425 is excessively small, causing, for example, deterioration in electrical properties. When the width of the line portion 425 exceeds 300 um, the first electrode line 423 may have an increased area despite the contact between the first electrode line 423 and the line portion 425 not being greatly increased, which may cause, for example, increased shading loss and manufacturing costs. However, the present invention is not limited thereto. Thus, the width of the line portion 425 may be changed to various values within the range in which current generated by photoelectric conversion may be effectively transferred and shading loss may be minimized.

In addition, the width W2 of the pad portion 424 may be greater than the width of the line portion 425 and may be equal to or greater than the width W1 of the interconnector 142. Since the pad portion 424 serves to increase the contact area for the interconnector 142 so as to increase attachment force for the interconnector 142, the pad portion 424 has a width that is greater than the line portion 425 and is equal to or greater than the width W1 of the interconnector 142.

Alternatively, in one example, the width of the pad portion 424 may range from 0.2 mm to 2.5 mm (e.g. 0.2 mm to 2.0 mm). When the width of the pad portion 424 is below 0.2 mm, the contact area between the pad portion 424 and the interconnector 142 may be insufficient, and thus the attachment force between pad portion 424 and the interconnector 142 may be insufficient. When the width of the pad portion 424 exceeds 2.5 mm, the area by which the pad portion 424 causes shading loss may be increased, which may increase shading loss. In one example, the width of the pad portion 424 may range from 0.8 mm to 1.5 mm.

The length of the pad portion 424 may range from 1 mm to 5 mm. When the length of the pad portion 424 is below 1 mm, the contact area between the pad portion 424 and the interconnector 142 may be insufficient, and consequently, the attachment force between the pad portion 424 and the interconnector 142 may be insufficient. When the length of the pad portion 424 exceeds 5 mm, the area by which the pad portion 424 causes shading loss may be increased, which may increase shading loss. However, the present invention is not limited thereto, and the width and length of the pad portion 424 may be changed to various values. In addition, instead of providing both the pad portion 424 and the light portion 425 having different widths, the first electrode line 423 may include only the line portion 425 or the pad portion 424 having a consistent width.

The above description has been focused on the first electrode line 423 with reference to the enlarged circle of FIG. 5 and FIGS. 6 and 7. The second electrode line 443 may substantially correspond to the first electrode line 423. At this time, for example, the first electrode line 423 and the second electrode line 443 may have the same width or pitch, or may have different widths or pitches.

In one example, in consideration of shading loss, the width of the first electrode line 423 may be less than the width of the second electrode line 443, and/or the pitch of the first electrode lines 423 may be greater than the width of the second electrode lines 443. Even in this case, the first electrode line 423 and the second electrode line 443 may have the same width or pitch. Alternatively, the electrode lines 423 and 443 may have different plan shapes. For example, the second electrode line 443 may be formed throughout the back surface of the semiconductor substrate 160. Various other alterations are possible.

In this way, the present embodiment relates to a bi-facial structure in which the electrode lines 423 and 443 of the solar cell 150 extend in a given direction so that light may be introduced into the front surface and the back surface of the semiconductor substrate 160. Thereby, the quantity of light to be used in the solar cell 150 may be increased, which may increase the efficiency of the solar cell 150. However, the present invention is not limited thereto, and the second electrode line 443 may be formed throughout the back surface of the semiconductor substrate 160.

According to the present embodiment, since an electrode is formed in the form of the first electrode line 423, it is possible to reduce, for example, the processing time and material required to form an additional electrode (e.g. a finger electrode) that intersects the first electrode line 423.

Hereinafter, a solar cell and a solar cell panel including the same according to another embodiment of the present invention will be described in detail with reference to the accompanying drawings. A detailed description of parts, which are the same as or extremely similar to the above description, will be omitted and only different parts will be described in detail. In addition, combinations of the above-described embodiment or modifications thereof and the following embodiment or modifications thereof are included in the scope of the present invention.

Figure 8:
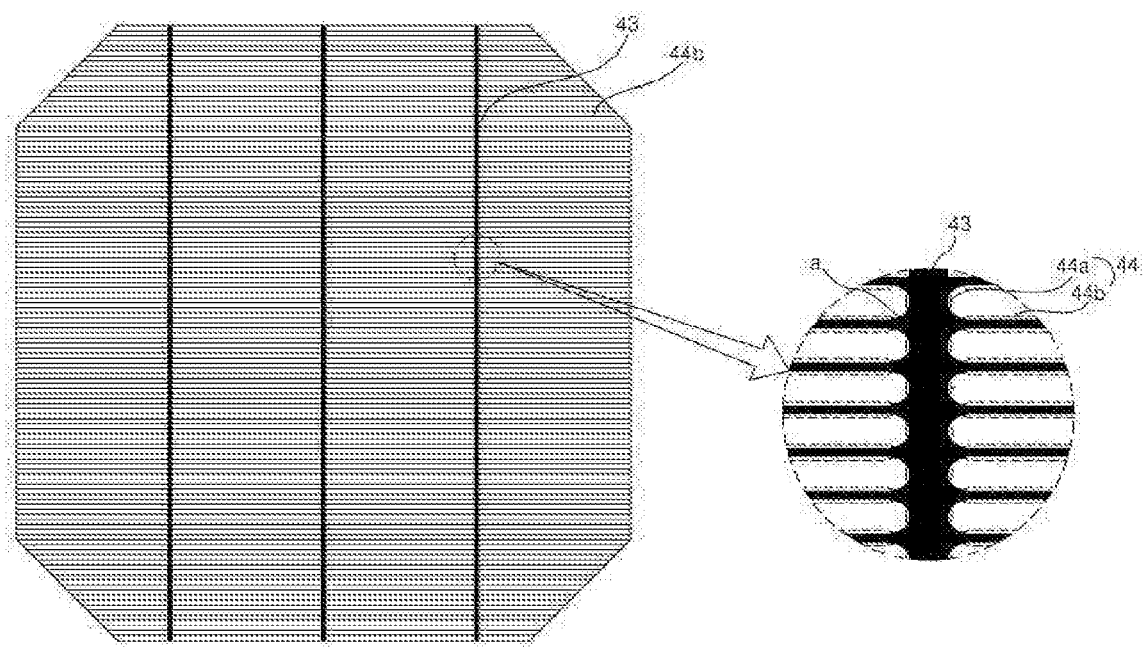
FIG. 8 is a plan view illustrating a solar cell included in a conventional solar cell panel.

FIG. 8 illustrates a conventional solar cell.

Referring to FIG. 8, in the conventional solar cell, an electrode 44 includes an electrode line 44a, and a finger electrode 44b that intersects the electrode line 44a, and an interconnector 43 is disposed on the electrode line 44a. In this case, due to the finger electrode 44b intersecting the electrode line 44a, a solder in the interconnector 43 may spread by surface tension at the intersection of the electrode line 44a and the finger electrode 44b, which may cause a shading area "a".

Unlike this, referring again to FIGS. 6 and 7, in the present invention, the electrode line 423 includes no finger electrode, and therefore, there is no intersection of the finger electrode and the electrode line. That is, as shown in FIGS. 6 and 7, the solar cell 150 lacks a metal electrode that intersects the interconnector 142 on the semiconductor substrate 160. Thus, the solar cell according to the present invention may minimize the shading area, thus achieving increased efficiency. In addition, no material (e.g. silver (Ag)) may be required to form the finger electrode, which enables the solar cell according to the present invention to be manufactured using a cheaper process.

Hereinafter, a solar cell and a solar cell panel including the same according to another embodiment of the present invention will be described in detail with reference to the accompanying drawings. A detailed description of parts, which are the same as or extremely similar to the above description, will be omitted and only different parts will be described in detail. In addition, combinations of the above-described embodiment or modifications thereof and the following embodiment or modifications thereof are included in the scope of the present invention.

Figure 9:
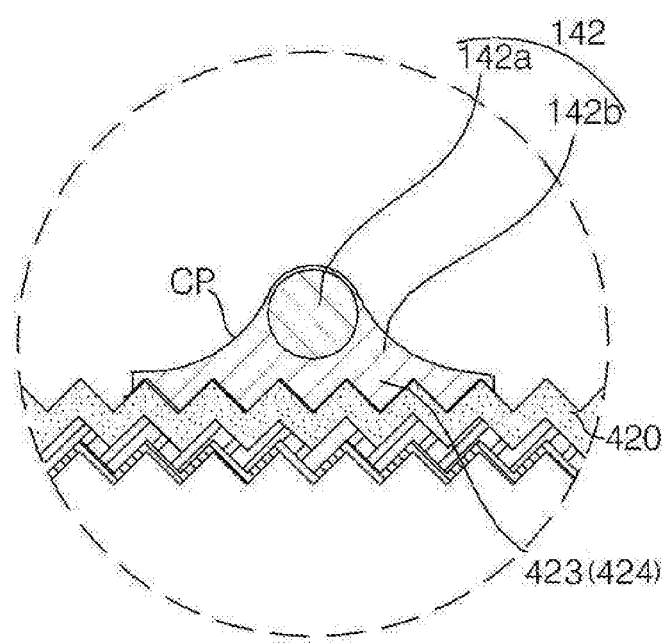
FIG. 9 is a partially enlarged cross-sectional view illustrating a portion of a solar cell included in a solar cell panel according to another embodiment of the present invention.

FIG. 9 is a partially enlarged cross-sectional view illustrating a portion of a solar cell included in a solar cell panel according to another embodiment of the present invention. For clear and brief illustration, FIG. 9 illustrates only the portion corresponding to the enlarged circle of FIG. 5.

Referring to FIG. 9, the solar layer 142b of the interconnector 142 may be directly connected to the first transparent electrode layer 420. In this case, the solder layer 142b may be formed of a tin compound including indium that has a relatively low melting point.

In the present embodiment, since the interconnector 142 may be directly formed on the semiconductor substrate 160 without an electrode line, the manufacturing process may be simplified.

Figure 10:
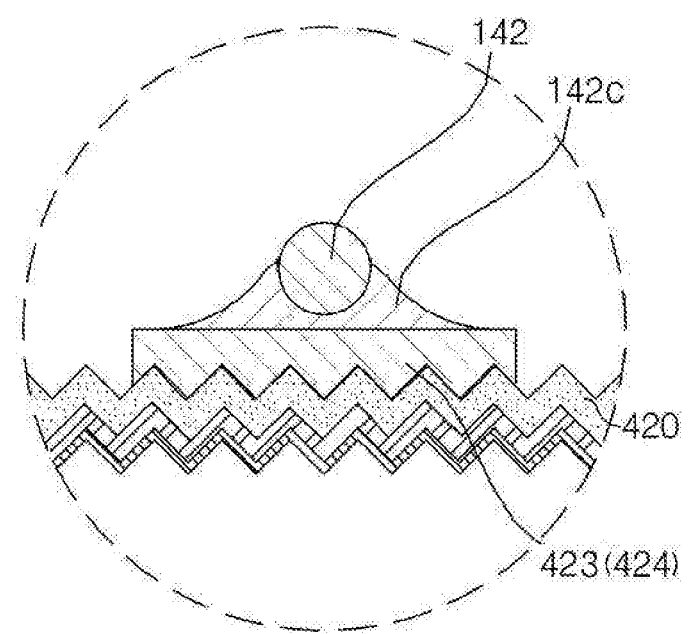
FIG. 10 is a partially enlarged cross-sectional view illustrating a portion of a solar cell included in a solar cell panel according to another embodiment of the present invention.

FIG. 10 is a partially enlarged cross-sectional view illustrating a portion of a solar cell included in a solar cell panel according to another embodiment of the present invention. For clear and brief illustration, FIG. 9 illustrates only the portion corresponding to the enlarged circle of FIG. 5.

Referring to FIG. 10, the interconnector 142 may be formed on the pad portion 424 via a conductive adhesive 142c. The conductive adhesive 142c may include a conductive filler and an adhesive resin, like an electrically conductive adhesive (ECA). In this case, the interconnector 142 may include no solder layer and may include only a core layer formed of a metal, without being limited thereto.

In the present embodiment, since the interconnector 142 may be formed on the semiconductor substrate 110 via the conductive adhesive 142c, the manufacturing process may be simplified, and any negative effect due to a solder may be prevented.

Figure 11:
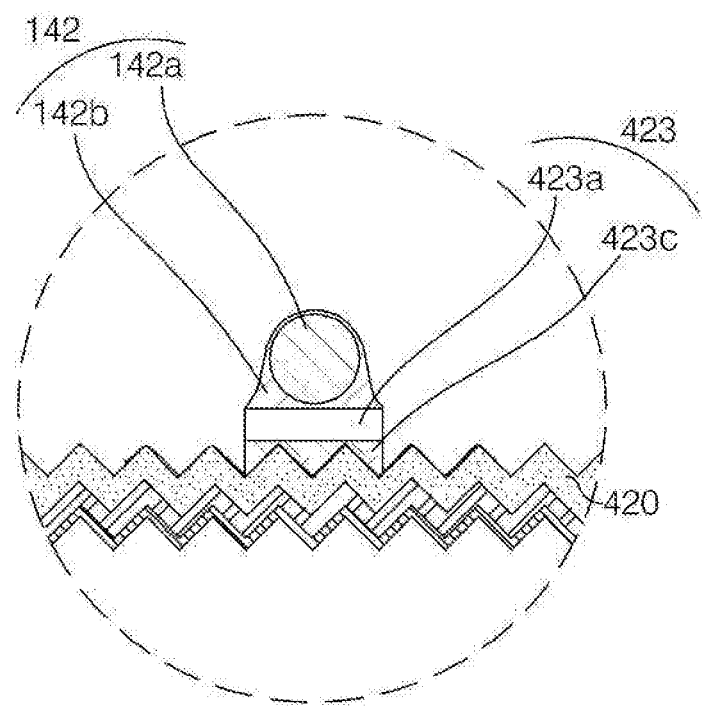
FIG. 11 is a partially enlarged cross-sectional view illustrating a portion of a solar cell included in a solar cell panel according to another embodiment of the present invention.

FIG. 11 is a partially enlarged cross-sectional view illustrating a portion of a solar cell included in a solar cell panel according to another embodiment of the present invention. For clear and brief illustration, FIG. 9 illustrates only the portion corresponding to the enlarged circle of FIG. 5.

Referring to FIG. 11, the first electrode line 423 may be a conductive tape. Specifically, the first electrode line 423 may include a conductive layer 423a and a conductive adhesive layer 423c. The conductive layer 423a may include a metal, such as aluminum or copper. For example, the conductive layer 423a may include tin-plated copper. However, in the present embodiment, the conductive layer 423a may be formed of a ductile metal, in order to be connected to the adjacent solar cell. The conductive layer 423a may be electrically connected to the first transparent electrode layer 420 via the conductive layer 423a. The conductive layer 423a may include a conductive filler and an adhesive resin, like an electrically conductive adhesive (ECA).

Meanwhile, in the present embodiment, the first electrode line 423, which is a conductive tape, may have a width that is equal to or greater than that of the interconnector 142 disposed on the first electrode line 423. However, the present invention is not limited thereto, and the first electrode line 423 according to the present embodiment may have any of various widths as needed.

Figure 12:
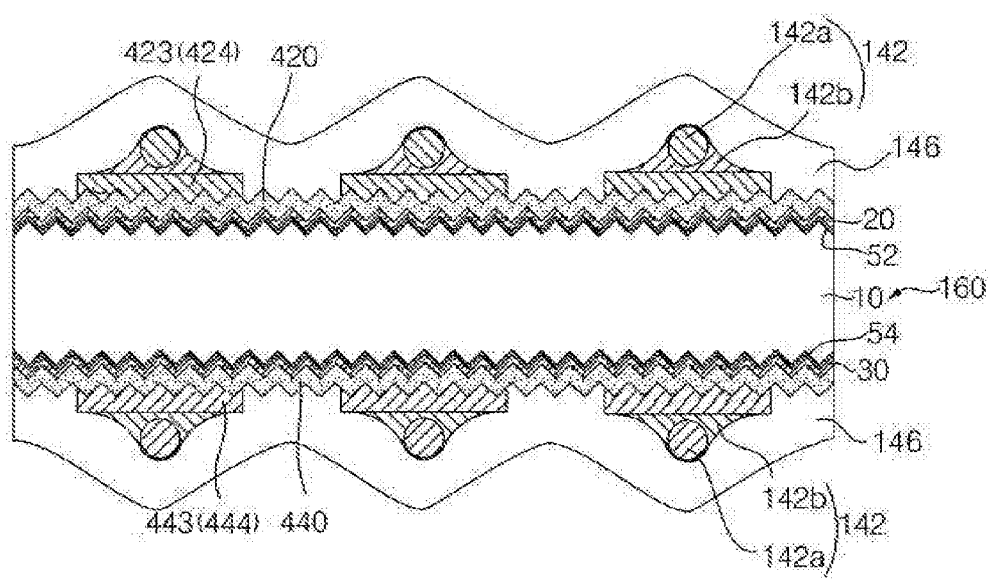
FIG. 12 is a cross-sectional view illustrating a solar cell included in a solar cell panel according to a further embodiment of the present invention.

In the present embodiment, since the first electrode line 423 may be a conductive tape, and thus may be directly formed on the semiconductor substrate 160 without a metal patterning process, the manufacturing process may be simplified and the manufacturing time may be reduced. FIG. 12 is a cross-sectional view illustrating a solar cell included in a solar cell panel according to a further embodiment of the present invention.

Referring to FIG. 12, the solar cell according to the present embodiment may further include transparent sheets 157 formed respectively on the front surface and the back surface of the semiconductor substrate 160. The transparent sheets 146 may be disposed on the front surface and the back surface of the semiconductor substrate 160 so as to cover all of the interconnectors 142 and the first and second electrode layers 420 and 440.

The transparent sheet 146 may be formed of a polymer material including, for example, a resin, may protect the solar cell from an external environment, and may increase the adhesive force of the interconnectors 142.

The above described features, configurations, effects, and the like are included in at least one of the embodiments of the present invention, and should not be limited to only one embodiment. In addition, the features, configurations, effects, and the like as illustrated in each embodiment may be implemented with regard to other embodiments as they are combined with one another or modified by those skilled in the art. Thus, content related to these combinations and modifications should be construed as including in the scope and spirit of the invention as disclosed in the accompanying claims.

What is claimed is:
1. A solar cell panel comprising:
   a plurality of solar cells; and
   a plurality of interconnectors for electrically connecting the plurality of solar cells to each other and extending in a first direction, respectively,
   wherein each of the plurality of solar cells includes:
      a semiconductor substrate;

a first conductive area disposed on a first surface of the semiconductor substrate;
a second conductive area disposed on a second surface of the semiconductor substrate which is opposite the first surface of the semiconductor substrate;
a first transparent conductive oxide layer disposed on the first conductive area;
a second transparent conductive oxide layer disposed on the second conductive area; and
a plurality of first metal electrode lines extending in the first direction on the first transparent conductive oxide layer,
wherein each of the plurality of first metal electrode lines includes a plurality of pad portions spaced apart from each other in the first direction and interconnected with one another by line portions,
wherein each of the plurality of first metal electrode lines is electrically connected to an adjacent first metal electrode line via only the first transparent conductive oxide layer without a finger electrode,
wherein each of the plurality of interconnectors comprises a core layer coated by a solder layer, wherein each core layer of the plurality of interconnectors has a circular, oval, or rounded cross-section,
wherein each pad portion has a larger width than each core layer of the plurality of interconnectors, and a width of each line portion is less than a maximum width of each core layer of the plurality of interconnectors,
wherein each of the plurality of interconnectors is directly connected to and arranged over the plurality of first metal electrode lines and the plurality of pad portions by the solder layer,
wherein a maximum width of each solder layer of the plurality of interconnectors is less than a maximum width of each pad portion,
wherein the plurality of interconnectors each have a diameter ranging from 100 um to 300 um, and
wherein each of the plurality of interconnectors overlaps only one metal electrode line respectively among the plurality of first metal electrode lines, and there is no finger electrode disposed on the first transparent conductive oxide layer and in a second direction perpendicular to the first direction.

2. The solar cell panel according to claim 1, wherein the number of the plurality of interconnectors ranges from 12 to 30.

3. The solar cell panel according to claim 1, wherein the plurality of interconnectors are spaced apart from one another at a constant pitch, and the constant pitch ranges from 3 mm to 11 mm.

4. The solar cell panel according to claim 1, wherein the plurality of interconnectors are spaced apart from one another at a constant pitch, and the constant pitch ranges from 2% to 7% of a length of one of the plurality of solar cells in a direction perpendicular to the first direction in which the plurality of first metal electrode lines extend.

5. The solar cell panel according to claim 1, wherein each solder layer of the plurality of interconnectors is disposed on a surface of the plurality of pad portions that is opposite a remaining surface facing the first transparent conductive oxide layer, and is not disposed on a side surface of the plurality of pad portions.

6. The solar cell panel according to claim 1, further comprising a transparent adhesive sheet covering the plurality of interconnectors.

7. The solar cell panel according to claim 1, wherein each of the plurality of interconnectors is electrically connected to an adjacent interconnector via only the first transparent conductive oxide layer on one semiconductor substrate.

8. The solar cell panel according to claim 1, wherein at least one of the first transparent conductive oxide layer and the second transparent conductive oxide layer includes nano-scale conductive materials dispersed in an upper surface thereof.

9. The solar cell panel according to claim 8, wherein the nano-scale conductive materials include conductive nano-wires, conductive nano-particles, or carbon nano-tubes.

10. The solar cell panel according to claim 1, wherein each first conductive area includes a front-surface field area, which is of the same conductive type as each semiconductor substrate and has a higher doping concentration than each semiconductor substrate, and
wherein each second conductive area includes an emitter area of a conductive type that is opposite to that of each semiconductor substrate.

11. The solar cell panel according to claim 1, wherein each of the plurality of solar cells further includes a first passivation layer disposed between the semiconductor substrate and the first conductive area, and a second passivation layer disposed between the semiconductor substrate and the second conductive area.

12. The solar cell panel according to claim 1, further comprising:
a plurality of second metal electrode lines, which are disposed between the second transparent conductive oxide layer and the plurality of interconnectors, via additional solder layers.

13. The solar cell panel according to claim 1, wherein each solder layer includes an inflection point where a curvature of which varies, located on a side surface of the solder layer.

14. The solar cell panel according to claim 1, wherein the first surface of the semiconductor substrate and the first transparent conductive oxide layer have protrusions, and the protrusions of the first transparent conductive oxide layer extend into the plurality of pad portions.

15. The solar cell panel according to claim 1, wherein the plurality of pad portions directly contact the first transparent conductive oxide layer.

16. The solar cell panel according to claim 1, wherein the plurality of interconnectors and the plurality of first metal electrode lines are parallel and overlap, respectively.

17. The solar cell panel according to claim 1, wherein the plurality of pad portions include first pad portions adjacent to opposite ends of the plurality of first metal electrode lines and second pad portions excluding the first pad portions, wherein each of the first pad portions has at least a larger length or width than each of the second pad portions.

18. The solar cell panel according to claim 1, wherein a ratio of the maximum width of each solder layer to the maximum width of each pad portion ranges from 1:1.1 to 1:4.5.

19. A solar cell panel comprising:
a plurality of solar cells; and
a plurality of interconnectors for electrically connecting the plurality of solar cells to each other and extending in a first direction, respectively,
wherein each of the plurality of solar cells includes:
a semiconductor substrate;
a first conductive area disposed on a first surface of the semiconductor substrate;
a second conductive area disposed on a second surface of the semiconductor substrate which is opposite the first surface of the semiconductor substrate;

a first transparent conductive oxide layer disposed on the first conductive area;

a second transparent conductive oxide layer disposed on the second conductive area; and a plurality of first metal electrode lines extending in the first direction on the first transparent conductive oxide layer, wherein each of the plurality of first metal electrode lines includes a plurality of pad portions spaced apart from each other in the first direction and interconnected with one another by line portions, wherein each of the plurality of first metal electrode lines is electrically connected to an adjacent first metal electrode line via only the first transparent conductive oxide layer without a finger electrode, wherein each of the plurality of interconnectors comprises a core layer coated by a solder layer, wherein each core layer of the plurality of interconnectors has a circular, oval, or rounded cross-section, wherein each pad portion has a larger width than each core layer of the plurality of interconnectors, wherein a width of each line portion is less than a maximum width of each core layer of the plurality of interconnectors, wherein each core layer of the plurality of interconnectors has a variable width such that as the distance between the width of each core layer and an upper surface of each line portion is reduced, the width of each core layer continuously decreases, wherein each of the plurality of interconnectors is directly connected to and arranged over the plurality of first metal electrode lines and the plurality of pad portions by the solder layer, wherein a maximum width of each solder layer of the plurality of interconnectors is less than a maximum width of each pad portion, and wherein a ratio of the maximum width of each solder layer to the maximum width of each pad portion ranges from 1:1.1 to 1:4.5.

20. The solar cell panel according to claim 1, wherein each core layer of the plurality of interconnectors has a variable width such that as the distance between the width of each core layer and an upper surface of each line portion is reduced, the width of each core layer continuously decreases.

* * * * *